(12) United States Patent
Motwani et al.

(10) Patent No.: US 9,819,362 B2
(45) Date of Patent: Nov. 14, 2017

(54) APPARATUS AND METHOD FOR DETECTING AND MITIGATING BIT-LINE OPENS IN FLASH MEMORY

(71) Applicant: Intel Corporation, Santa Clara, CA (US)

(72) Inventors: Ravi H. Motwani, San Diego, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 14/671,140

(22) Filed: Mar. 27, 2015

(65) Prior Publication Data

US 2016/0283320 A1 Sep. 29, 2016

(51) Int. Cl.
| | | |
|---|---|---|
| *H03M 13/15* | (2006.01) | |
| *H03M 13/11* | (2006.01) | |
| *G06F 11/10* | (2006.01) | |
| *G11C 29/02* | (2006.01) | |
| *G11C 29/42* | (2006.01) | |
| *G11C 29/52* | (2006.01) | |
| *G11C 7/10* | (2006.01) | |

(Continued)

(52) U.S. Cl.
CPC ..... *H03M 13/1515* (2013.01); *G06F 11/1012* (2013.01); *G06F 11/1024* (2013.01); *G06F 11/1068* (2013.01); *G11C 29/025* (2013.01); *G11C 29/42* (2013.01); *H03M 13/1102* (2013.01); *G11C 7/1006* (2013.01); *G11C 16/0483* (2013.01); *G11C 29/52* (2013.01); *G11C 2029/1204* (2013.01)

(58) Field of Classification Search
CPC ............ G06F 11/1068; G06F 11/1012; G06F 11/1024; H03M 13/1102; H03M 13/1515; G11C 29/025; G11C 29/42; G11C 29/52; G11C 2029/1204; G11C 16/0483; G11C 7/1006
USPC ....... 714/764, 763, 768, 773, 752, 758, 784, 714/780, 786, 799; 365/185.09, 200, 201
See application file for complete search history.

(56) References Cited

U.S. PATENT DOCUMENTS

| | | | | |
|---|---|---|---|---|
| 8,370,710 | B2 * | 2/2013 | Kim .................... | G06F 11/1068 714/763 |
| 9,007,854 | B1 * | 4/2015 | Nemati Anaraki ..... | G06F 11/10 365/189.09 |
| 9,105,359 | B2 * | 8/2015 | Choi ................ | G11C 29/50004 |

(Continued)

OTHER PUBLICATIONS

International Search Report and Written Opinion, dated Jun. 8, 2016, for PCT Patent Application No. PCT/US2016/017228, 12 pages.

(Continued)

*Primary Examiner* — John J Tabone, Jr.
(74) *Attorney, Agent, or Firm* — Green, Howard & Mughal LLP

(57) ABSTRACT

Described is a method which comprises performing a first read from a portion of a non-volatile memory, the first read to provide a first codeword; decoding the first codeword; determining whether the decoding operation failed; performing a second read from the portion of the non-volatile memory when it is determined that the decoding operation failed, the second read to provide a second codeword; and decoding the second codeword with an errors-and-erasures decoding process.

20 Claims, 6 Drawing Sheets

(51) Int. Cl.
*G11C 16/04* (2006.01)
*G11C 29/12* (2006.01)

(56) References Cited

U.S. PATENT DOCUMENTS

| | | | | |
|---|---|---|---|---|
| 2003/0023911 A1* | 1/2003 | Davis | ............... | G06F 11/1008 |
| | | | | 714/723 |
| 2010/0077279 A1* | 3/2010 | Kim | ............... | G06F 11/1068 |
| | | | | 714/755 |
| 2011/0252283 A1 | 10/2011 | Mokhlesi et al. | | |
| 2013/0326296 A1* | 12/2013 | Choi | ............... | G11C 29/50004 |
| | | | | 714/721 |
| 2014/0281839 A1 | 9/2014 | Kwok | | |
| 2015/0089323 A1* | 3/2015 | Kou | ............... | G06F 11/1012 |
| | | | | 714/764 |

OTHER PUBLICATIONS

Office Action and Search Report for Taiwan Patent Application No. 105103554 dated Jan. 23, 2017, 10 pages.

* cited by examiner

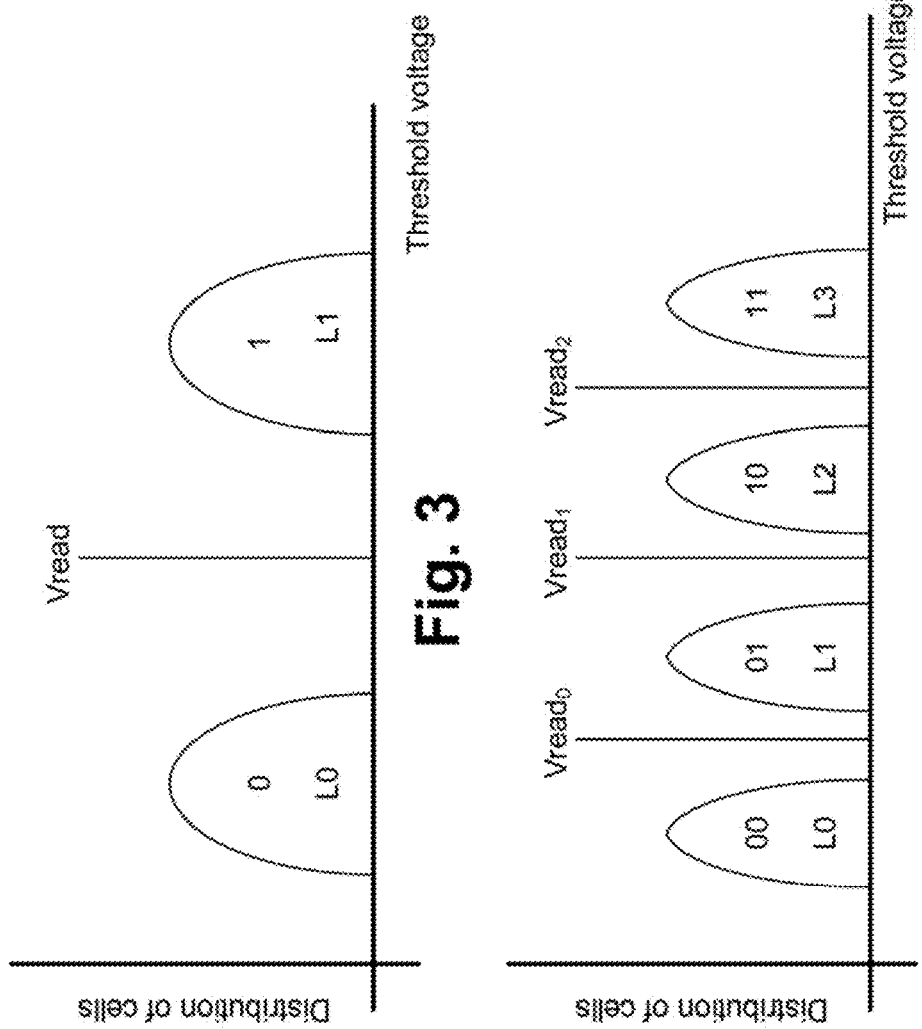

APPARATUS AND METHOD FOR DETECTING AND MITIGATING BIT-LINE OPENS IN FLASH MEMORY

BACKGROUND

Defects in the form of open lines or shorts are prevalent in non-volatile memories such as NAND flash memories. These defects can be present at the time of manufacture, or can be generated through the operating life of the memories. The defects can also be caused by regular wear and tear (e.g., periodic refresh operations over a long time). These defects contribute towards Raw Bit Error rate (RBER). The term "RBER" here generally refers to the rate of errors when reading from a non-volatile memory. If Low-Density Parity-Check Code (LDPC) is used to encode input data which is stored in the NAND flash memory, and when a soft read operation is performed, the open lines or circuits generally referred here as "opens") the read memory may manifest as errors with high confidence (or errors with high reliability value, where reliability is the magnitude of the Log Likelihood Ratio (LLR)).

Having open circuits or open lines means that the memory cell cannot be used to store data. These high confidence errors are more detrimental to LDPC performance than soft errors. One reason for such detriment is that soft errors can allow LDPC decoding to continue (and the decoded result has a high chance of being corrected by error correction schemes) while hard (or high confidence errors) may cause LDPC decoding to fail with low or no chance of being corrected by the error correction schemes.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 illustrates a plot showing distribution of cells for a two threshold level (e.g., 2-level, 1 bit/cell) NAND memory cell.

FIG. 4 illustrates a plot showing distribution of cells for a multi-threshold level (e.g., 4-levels, 2 bits/cell) NAND memory cell.

DETAILED DESCRIPTION

Figure 1:
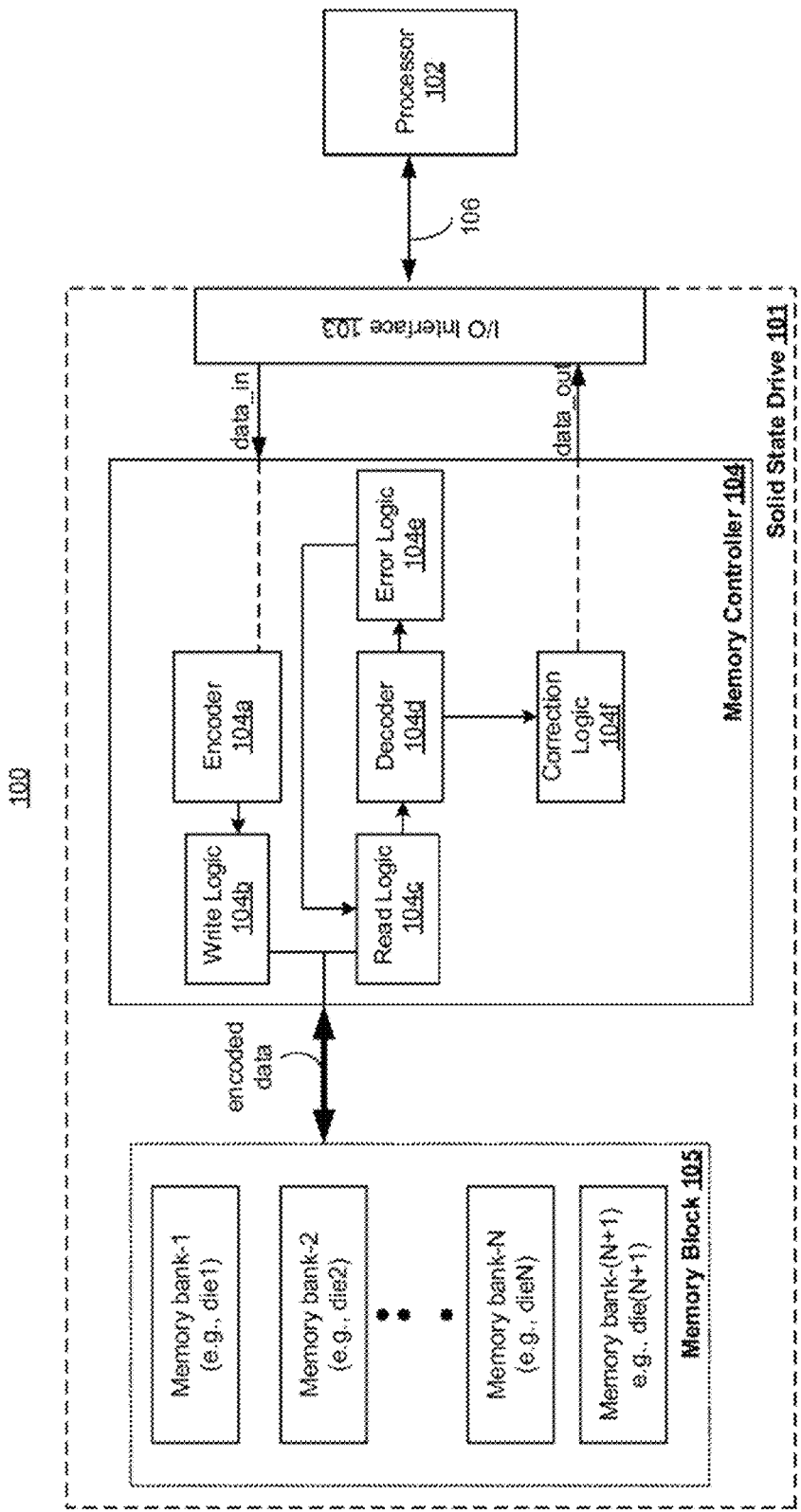
FIG. 1 illustrates an architecture with an apparatus to detect and mitigate defects caused by bit-line opens in a non-volatile memory, according to some embodiments of the disclosure.

Various embodiments describe a method and apparatus to handle (i.e., detect and mitigate) opens in a non-volatile memory gracefully by maintaining high error correction capability by appropriately tailoring decoding algorithms and media (e.g., logic and registers) providing additional information. In some embodiments, errors caused by opens are converted to erasures by logic and registers providing real-time information on opens, and by a decoding mechanism using this information to identify opens as erasures. Converting errors to erasures significantly improves error correction capability, which reduces the codeword failure probability.

The term "codeword failure probability" here generally refers to the probability that an encoded codeword would fail decoding. An error caused by an open appears as high confidence incorrect information which is worse than a soft error which is usually wrong information with low confidence (of being wrong). It will be understood that soft errors are a type of transient errors that may be those caused by cosmic radiation or some other anomaly or environmental condition that randomly affects bits. Such soft errors are typically limited to a single bit or a column. Such soft errors may occur during one read and not a subsequent read. In contrast, persistent errors or hard errors or hard failures are those caused by a device defect. An error caused by an open appears as high confidence incorrect information. The high confidence error has a higher chance of causing the decoding algorithm to fail. As such, converting errors to erasures reduces the probability of codeword failure in accordance to some embodiments. Various embodiments described here process hard errors in the form of opens instead of soft errors.

An erasure is generally defined as a location in the codeword (which refers to a location in the memory array) whose bit value is lost (i.e., no bit information exists about that location and so it is referred to as an erasure). The erasures are received by a decoder (e.g., a Low-Density Parity-Check Code (LDPC) decoder) which applies a decoding algorithm with knowledge about the erasures (i.e., locations in the codeword with lost bit values). The decoding algorithm, when armed with information about erasures instead of errors, has a higher chance of continuing to operate. For example, decoding algorithm can work with twice as many erasures than errors for error correction algebraic codes like Reed-Solomon. The output of the decoder is then corrected by a correction logic. Conversely, errors may cause the decoding algorithm to fail, and as such the correction logic may not correct the read data (or codeword).

Here, the term "read voltage" or "Vread" generally refers to a threshold voltage applied to a gate terminal of the selected memory cell to turn it on and to determine the state of that selected cell. Here the term "pass voltage" or "Vpass" generally refers to a threshold voltage applied to all word-lines (i.e., gate terminals of all un-selected cells in a string of memory cells) to cause the memory cells to be turned on so as to pass down their values to a ground node.

In some embodiments, a method and apparatus is provided in which a read logic performs a first read operation from a portion of a non-volatile memory (e.g., a block in an array of NAND flash memory), where the first read provides a first codeword (e.g., a LDPC). In some embodiments, the first read operation is performed by applying a read voltage (i.e., Vread) to a selected word-line (WL) of the portion of the non-volatile memory, and then by applying a pass voltage (i.e., Vpass) to all other word-lines in the portion of the non-volatile memory.

In some embodiments, a decoder is used for decoding the first codeword. In some embodiments, a logic is provided which determines whether the decoding operation failed. For example, if the number of soft errors obtained from the decoding process are above a threshold level then the decoding operation is considered to have failed. In some embodiments, when the logic determines that the decoding operation failed, the logic requests the read logic to perform a second read operation. In some embodiments, the second read operation is performed by applying the pass voltage to the selected word-line (i.e., now all word-lines in the block (i.e., portion) of the non-volatile memory receive the pass voltage). The second read operation provides a second codeword. In some embodiments, the second codeword ascertains a location of an open circuit. In some embodiments, the location of the open circuit is stored in a register so that the decoder can use that information when performing the errors-and-erasures decoding process. In some embodiments, the errors-and-erasures decoding process flags the open circuit as erasures.

There are many technical effects of various embodiments. The various embodiments permit detection of these defects (i.e., opens) with one extra read command. In some embodiments, this extra read command is the only extra read command. This detection of opens leads to higher endurance. For example, typically, at a defect probability of $2e^{-3}$ (i.e., 10-20% of total error handling capability), various embodiments result in a 2× reduction in RBER by identifying opens as erasures. As such, converting errors to erasures significantly improves error correction capability which reduces codeword failure probability.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or wireless connection between the things that are connected, without any intermediary devices. The term "coupled" means either a direct electrical, physical, or wireless connection between the things that are connected or an indirect electrical, physical, or wireless connection through one or more passive or active intermediary devices. The term "signal" means at least one current signal, voltage signal or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

FIG. 1 illustrates architecture 100 with an apparatus to detect and mitigate defects caused by bit-line opens in a non-volatile memory, according to some embodiments of the disclosure. In some embodiments, architecture 100 includes storage unit 101 and Processor 102. In some embodiments, storage unit 101 is a Solid State Drive (SSD). In other embodiments, other types of storage units may be used. In some embodiments, Processor 102 is a microprocessor (such as those designed by Intel Corporation of Santa Clara, Calif.), Digital Signal Processors (DSPs), Field-Programmable Gate Arrays (FPGAs), Application Specific Integrated Circuits (ASICs), or Radio-Frequency Integrated Circuits (RFICs), etc.

So as not to obscure the embodiments, a simplified version of memory architecture 100 is shown. A person skilled in the art would appreciate that there are other logic and circuits needed for complete operation of architecture 100. For example, syndrome calculators, queues, input-output buffers, multiplexers, sense amplifiers, etc., are not shown.

In some embodiments, SSD 101 includes I/O interface 103, Memory Controller 104, and a plurality of memory banks logically combined as Memory Block 105. In some embodiments, I/O interface 103 is a Serial Advanced Technology Attachment (SATA) interface and interconnect 106 is a SATA compliant bus coupling SSD 101 to Processor 102. A person skilled in the art would appreciate that in some cases, Processor 102 is indirectly coupled to SSD 101 via a bus controller (not shown). In other embodiments, other types of I/O interfaces may be used for I/O interface 103. For example, Serial Attached Small Computer System Interface (SCSI) (or simply SAS) may be used for I/O interface 103, and interconnect 106 is a SAS compliant interface; or Peripheral Component Interconnect Express (PCIe) as described in the PCI Express Base 3.0 Specification may be used for I/O interface 103.

While the embodiments of FIG. 1 are illustrated with two distinct components in SSD 101 and Processor 102, in some embodiments, storage unit 101 and Processor 102 can be packaged together as a single unit. In some embodiments, storage unit 101 and Processor 102 are implemented using three dimensional integrated circuit (3D IC) technology where various dies are stacked on each other. For example, various dies or components of SSD 101 may be implemented as dies that are stacked on a die of Processor 102 to form a stacked or 3D IC.

Here, memory banks (i.e., Memory bank-1 to Memory bank-(N+1), where 'N' is an integer) in Memory Block 105 are shown as a group of memory banks in one area. The terms "die" and "bank" here are interchangeably used and generally refer to an integrated circuit that may be packaged separately or integrated with other circuits. In some embodiments, the memory banks (or die 1 to die (N+1)) may be distributed in SSD 101. In some embodiments, each memory bank is a non-volatile memory. For example, each memory bank is a single or multi-threshold level NAND flash memory (as described with reference to FIGS. 3-4), NOR flash memory, single or multi-level Phase Change Memory (PCM), a three dimensional cross point memory, a resistive memory, nanowire memory, ferro-electric transistor random access memory (FeTRAM), magnetoresistive random access memory (MRAM) memory that incorporates memristor technology, spin transfer torque (STT)-MRAM, or a combination of any of the above, etc.

In some embodiments, Memory Controller 104 includes Encoder 104a, Write Logic 104b, Read Logic 104c, Decoder 104d, Error Logic 104e, and Correction Logic 104f. In some embodiments, Encoder 104a applies an error correction scheme to the input data (data_in) and generates encoded data (i.e., codewords). Each codeword includes a data portion and a corresponding parity portion. In some embodiments, the error correction scheme is one of LDPC scheme, or a Reed-Solomon code scheme. In other embodiments, other types of error correction schemes may be used, such as, Cyclic Redundancy Check (CRC) scheme, Hamming Code scheme, or Convolutional code scheme.

In some embodiments, the encoded codeword is written to Memory Block 105 by Write Logic 104b. In some embodiments, Write Logic 104b includes any suitable driver to drive data for writing to Memory Block 105. In some embodiments, the encoded codewords are distributed to memory banks (i.e., Memory bank-1 through Memory bank-N). In some embodiments, Memory Controller 104 communicates with Memory Block 105 (i.e., the various memory dies) via an Input/Output (I/O) interface and corresponding compliant bus. In some embodiments, Memory Controller 104 communicates with Memory Block 105 via an interface which is complaint to the Open NAND Flash Interface (ONFI) specification (e.g., Revision 4.0 released Apr. 2, 2014). In other embodiments, other types of interfaces may be used for communicating between Memory Controller 104 and Memory Block 105.

So as not to obscure various embodiments, Memory Block 105 is described as a NAND flash memory, Encoder 104a is described as an LDPC encoder, and Decoder 104d is described as a LDPC decoder. However, other types of suitable non-volatile memories, encoders, and decoders may be used. In some embodiments, Read Logic 104c is operable to read the encoded data from the one or more Memory banks from Memory Block 105. Read Logic 104c may be implemented using any suitable read circuits.

In some embodiments, Read Logic 104c performs a first read operation from a block in an array of NAND flash memory, where the result of the first read operation provides a first codeword (i.e., an LDPC codeword). In some embodiments, the first read operation is performed by applying a read voltage (Vread) to a selected word-line of the portion of the NAND memory (e.g., Memory bank-1), and then by applying a pass voltage (Vpass) to all other word-lines (i.e., to unselected cells) in the portion of the NAND memory as described with reference to FIG. 2.

Referring back to FIG. 1, in some embodiments, Decoder 104c decodes the first codeword by applying an error correction scheme (e.g., LDPC scheme) to decode the codewords encoded by Encoder 104a. In some embodiments, Error Logic 104e determines whether the decoding operation failed. For example, if the number of soft errors obtained from the decoding process (executed by Decoder 104d) are above a threshold level then the decoding operation is considered to have failed. In some embodiments, when Error Logic 104e determines that the decoding process has failed, Error Logic 104e requests Read Logic 104c to perform a second read.

Continuing with this example, if the number of soft errors obtained from the decoding process (executed by Decoder 104d) for the first read operation are equal to or below the threshold level, then the decoded codeword is processed by Correction Logic 104f. In some embodiments, the threshold level is programmable. In other embodiments, the threshold level is predetermined at the time of manufacture.

In some embodiments, the second read operation is performed by applying the pass voltage to the selected word-line (i.e., now all word-lines in the block of NAND memory receive the pass voltage). The result from the second read operation provides a second codeword. In some embodiments, the second codeword ascertains a location of an open circuit because the output of selected NAND string does not change even when the selected word-line is biased with the pass voltage. In some embodiments, this output of the selected NAND string is an output of a sense amplifier (not shown) coupled to the NAND flash memory.

In some embodiments, the location of the open circuit is stored in a register so that Decoder 104d can use that information when performing the errors-and-erasures decoding process which flags the open circuit as an erasure (instead of an error). In some embodiments, since the open bit-lines are block dependent and not word-line dependent, the locations for the opens can be stored for each block of the NAND flash memory. For example, the locations of the opens can be stored in registers outside of the NAND flash memory arrays. In some embodiments, once the locations of the opens are known, no extra sensing at Vpass is used. One technical effect of saving the extra sensing is that read latency is saved. In some embodiments, errors detected while reading the memory block are converted into erasures which allows for high correction probability. Erasures can be handled by LDPC Decoder 104d far better than errors. As such, the performance of LDPC Decoder 104d improves.

In some embodiments, a periodic update of open detection is performed and locations of the opens are detected and stored regularly. In some embodiments, open detection is performed before or after a refresh operation (i.e., background data refresh operation). For example, when data_in the NAND flash memory is about to be routinely refreshed, the process of detecting opens is performed and locations of the detected opens are stored in registers. In some embodiments, during refresh two read operations are performed—the first read operation (i.e., the normal read for a word-line) followed by the second read operation (i.e., applying Vpass for that word-line). As such, opens are identified for an entire block of memory which is being refreshed. In some embodiments, Correction Logic 104f corrects faults in the one or more memory banks (i.e., Memory banks-1 to Memory banks-N) using the decoded codeword (or part of it) obtained from the second read operation. The corrected output is then provided as output data data_out for processing by Processor 102.

Figure 2:
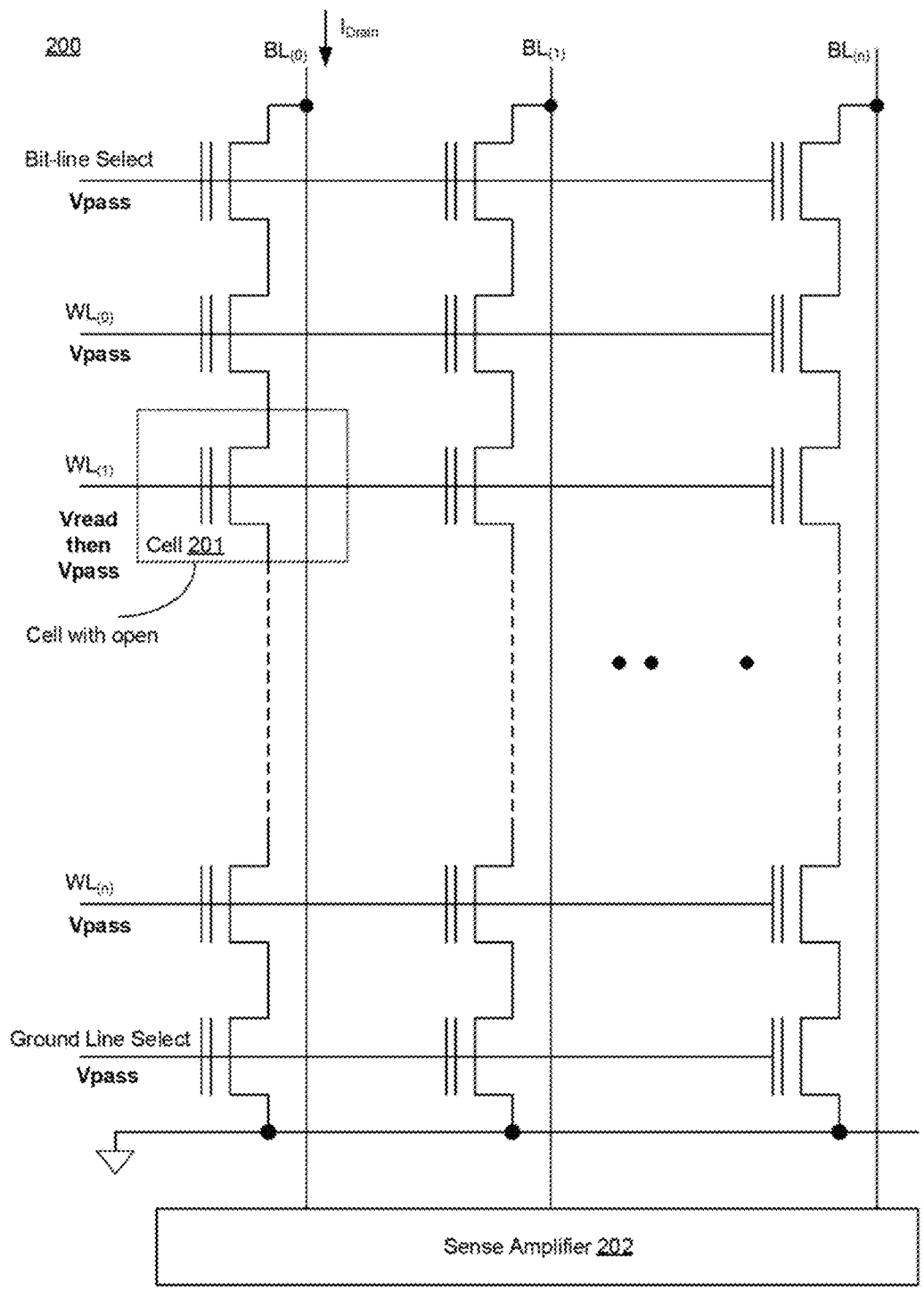
FIG. 2 illustrates a block of non-volatile NAND flash memory with an open associated with one of the memory cells.

FIG. 2 illustrates a block of non-volatile NAND flash memory 200 with an open associated with one of the memory cells. It is pointed out that those elements of FIG. 2 having the same reference numbers (or names) as the elements of any other figure can operate or function in any manner similar to that described, but are not limited to such.

NAND flash memory block 200 comprises strings of floating gate transistors (or cells), such that the transistors are coupled in series. The gate terminal of the first transistor in each string is coupled to a bit-line (e.g., $BL_{(0)-(n)}$) and controllable by a bit-line select signal. The last transistor in each string is coupled to ground (or a source-line) and controllable by a source line select signal (or ground select signal). The remaining transistors in the string are coupled to word-lines (e.g., $WL_{(0)-(n)}$).

In the absence of any defects, to read a value from a memory cell in a string, the bit-line select and ground select signals are asserted and one of the BLs is selected (e.g., $BL_{(0)}$). To select the memory cell of interest in the enabled or selected string, WL for that cell is set to a read voltage (Vread) and the remaining WLs are set to pass voltage (Vpass). The pass voltage is the voltage which is high enough to allow the memory cell (i.e., transistor) to pass its value down to ground, while the read voltage is the threshold voltage for the memory cell. Depending on the charge stored in the memory cell of interest and the read voltage, the BL is discharged or retains a certain charge. The BL is then sensed by Sense Amplifier 202 and the stored value (or state) in the selected memory cell is determined.

In the case of a defect, such as an open circuit in one of the memory cells of the selected string, BL is not discharged to ground. In this example, memory cell 201 has an open circuit (i.e., an open line). This open line can generate soft errors with high confidence during LDPC decoding. Various embodiments described here identify the open, the location of the open, and mitigate its effects by converting the error into an erasure, which is easier to handle by Decoder 104d when it applies an errors-and-erasures decoding process. The various embodiments are applicable to a variety of types of memory cells.

For example, some embodiments are applicable to NAND memories with Single Level Cells (SLCs), in which each memory cell stores two states (i.e., 1 bit programmed/read per memory cell). Here, the term "state" and threshold "level" are interchangeably used. FIG. 3 illustrates plot 300 showing distribution of cells for a two threshold level (i.e., 2-level, 1 bit/cell) NAND memory cell. Here, x-axis is threshold (i.e., programming voltage) and y-axis represents normalized number of memory cells. Vread is the read voltage that determines the state stored in the memory cell. When the voltage applied to the gate of the selected memory cell is Vread, then L0 (i.e., level zero) is read from the selected cell. To read L1 (i.e., level one), the voltage on Vread is increased until it is greater than the programmed threshold L1 for the cell.

In some embodiments, Vread is set by Read Logic 104b. In some embodiments, during the first read operation, the selected memory cell is biased by Vread. Depending on the value programmed in the memory cell, the Vread voltage is set to be above that threshold level to read from that memory cell. In some embodiments, during the second read operation, the selected memory cell is biased by Vpass instead of Vread. The second read ascertains whether there is an open in the selected memory cell or associated with the selected memory cell in accordance to some embodiments. Here, the erasure is the location of the memory cell whose data value is lost because of an open. In some embodiments, Decoder 104d applies an errors-and-erasures decoding process on the second codeword (which is obtained as a result of the second read operation). As such, Decoder 104d has a higher chance to decode the second codeword. During, errors-and-erasures decoding process for LDPC, the LLR for the erasures is set to zero. As such, an iterative decoding of LDPC codes is configured to decode errors and erasures.

Some embodiments are also applicable to NAND memories with Multi-level Cells (MLCs), in which each memory cell stores multiple states. For example, for a 4-level MLC NAND, four states (i.e., 2 bits programmed/read per memory cell) are stored in each memory cell, for 8-level MLC NAND, eight states (i.e., 3 bits programmed/read per memory cell) are stored in each memory cell, and so on. For 3 bits/cell to 4 bits/cell, individual memory cells are programmed to 8 or 16 distinct levels, respectively.

FIG. 4 illustrates plot 400 showing distribution of memory cells for a multi-threshold level (i.e., 4-levels, 2 bits/cell) NAND memory cell. Here, x-axis is threshold (i.e., programming voltage) and y-axis represents normalized number of memory cells. For MLC, multiple Vread levels are used to read the state stored in the MLC memory cell. In this example, four levels (i.e., L0, L1, L2, and L3) can be read by three different threshold levels of Vread—$Vread_0$, $Vread_1$, and $Vread_2$.

In some embodiments, $Vread_{0-2}$ is set by Read Logic 104b. In some embodiments, during the first read operation, the selected memory cell (e.g., memory cell 201) is biased by Vread. Depending on the value programmed in the memory cell, Vread is set to be above that threshold level to read the state from that memory cell. For example, $Vread_2$ is set to determine whether the selected memory cell stores L4 (i.e., one) or zero. In some embodiments, during the second read operation, the selected memory cell is biased by $Vpass_2$ instead of $Vread_0$ or $Vread_1$. The second read ascertains whether there is an open in the selected memory cell or associated with the selected memory cell. In some embodiments, Decoder 104d applies an errors-and-erasures decoding process on the second codeword (obtained as a result of the second read operation). As such, Decoder 104d has a higher chance to decode the second codeword.

Figure 5:
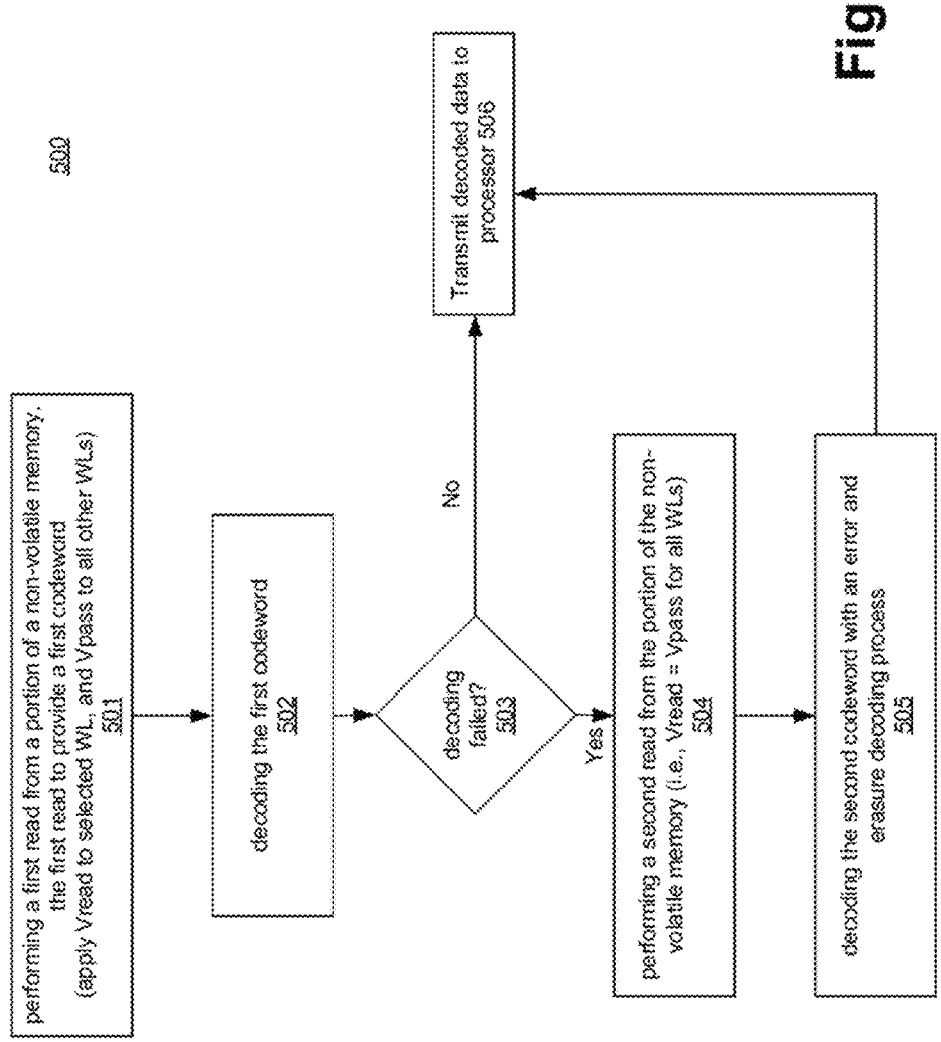
FIG. 5 illustrates a flowchart of a method for detecting and mitigating defects caused by bit-line opens in a non-volatile memory, according to some embodiments of the disclosure.

FIG. 5 illustrates 500 flowchart of a method for mitigating defects caused by bit-line opens in a non-volatile memory, according to some embodiments of the disclosure. It is pointed out that those elements of FIG. 5 having the same reference numbers (or names) as the elements of any other figure can operate or function in any manner similar to that described, but are not limited to such.

Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, a first read operation is performed by Read Logic 104b from a portion (i.e., block) of a non-volatile memory 105 (e.g., NAND flash memory). The first read provides a first codeword by applying Vread to the selected WL and Vpass to all other WLs. At block 502, Decoder 104d decodes the first codeword. For example, LDPC Decoder 104d applies an LDPC decoding scheme to decode the first codeword. At block 503, Error Logic 104e determines whether the decoding process failed. If a number of soft errors is greater than a threshold, then the decoding fails. If the decoding fails, the process proceeds to block 504, or else it proceeds to process to block 506. At block 506, the decoded codeword is transmitted to processor 102 for further processing.

At block 504, a second read operation is performed by Read Logic 104b from the portion of the non-volatile memory. The second read operation provides a second codeword by applying Vpass to the selected WL, where Vpass is provided to all WLs. By applying Vpass during the second read operation, the location of the open is determined. In some embodiments, the location of the open is stored in a register and passed on to Decoder 104d. The erasure is defined as the location of the open (i.e., location of the memory cell whose bit is lost).

At block 505, Decoder 104d performs errors-and-erasures decoding process on the second codeword (obtained as a result of the second read operation), and then provides the decoded codeword to processor 102 as illustrated by block 506. In some embodiments, a periodic update of open detection is performed and locations of the opens are detected and stored regularly. In some embodiments, open detection is performed during refresh operation (i.e., background data refresh operation).

Figure 6:
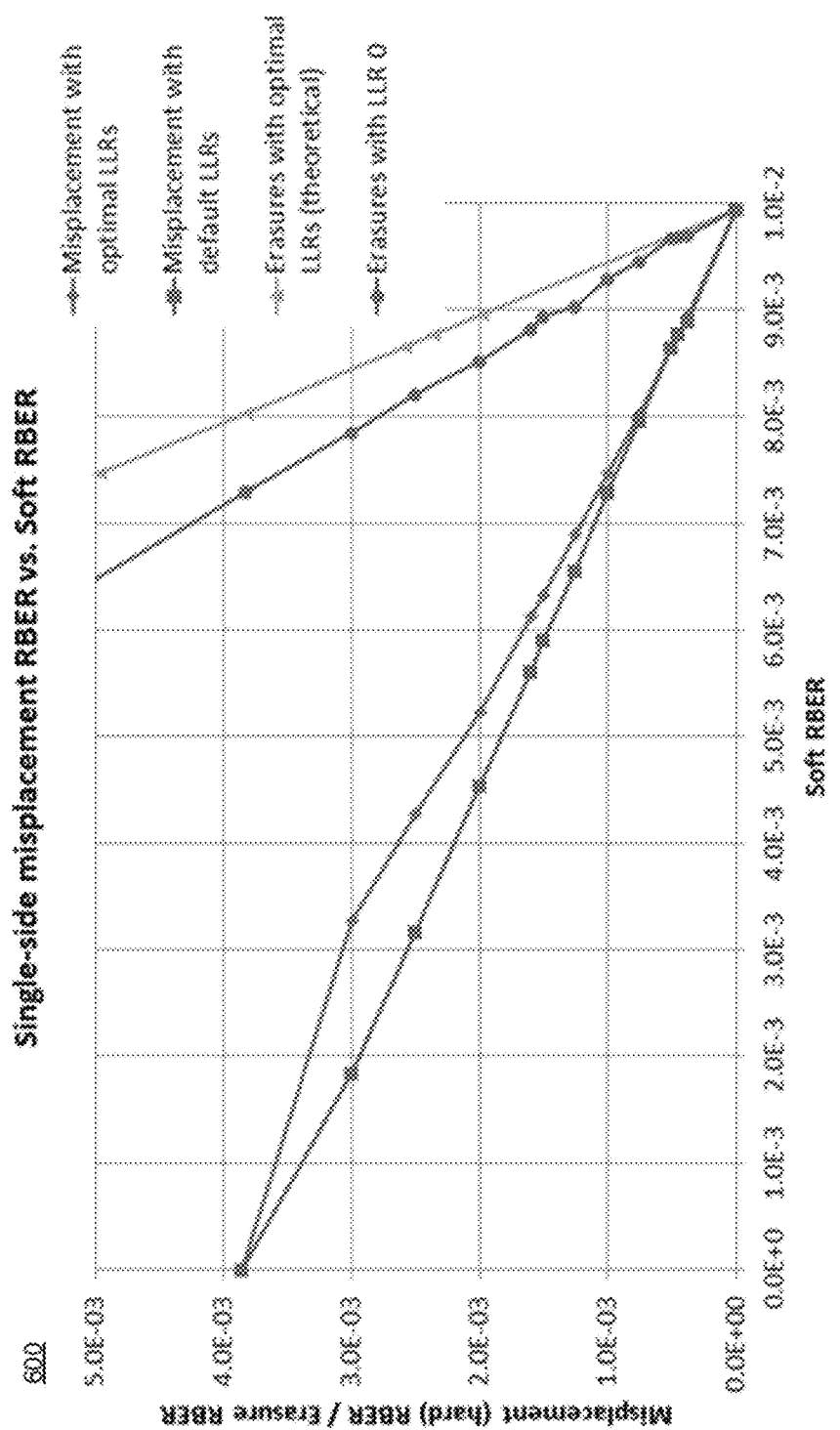
FIG. 6 illustrates a plot comparing defect probabilities versus soft Raw Bit Error rate (RBER) for Low-Density Parity-Check Code (LDPC) decoders that are informed of the open and for LDPC decoders without the information about the open, according to some embodiments.

FIG. 6 illustrates plot 600 comparing defect probabilities versus soft RBER for LDPC decoders that are informed of the open and for LDPC decoders without the information about the open, according to some embodiments. Here, x-axis is soft RBER and y-axis is defect probability as Misplacement (i.e., ratio of hard RBER to Erasure RBER).

Plot 600 illustrates LDPC performance with misplacement marked as erasures. Waveform 601 illustrates misplacement with default Log-likelihood ratios (LLRs). In this example, Waveform 602 illustrates misplacement with optimal LLRs. Waveform 603 illustrates erasures with optimal LLRs. Waveform 604 illustrates erasures with LLR as 0. In this example, comparing waveforms 603/604 and 601/602 shows that LDPC decoding continues even when erasures are 1.5 times more than hard errors. By converting errors into erasures, Decoder 104d can apply errors-and-erasures decoding process and has a higher chance to continue to decode.

Figure 7:
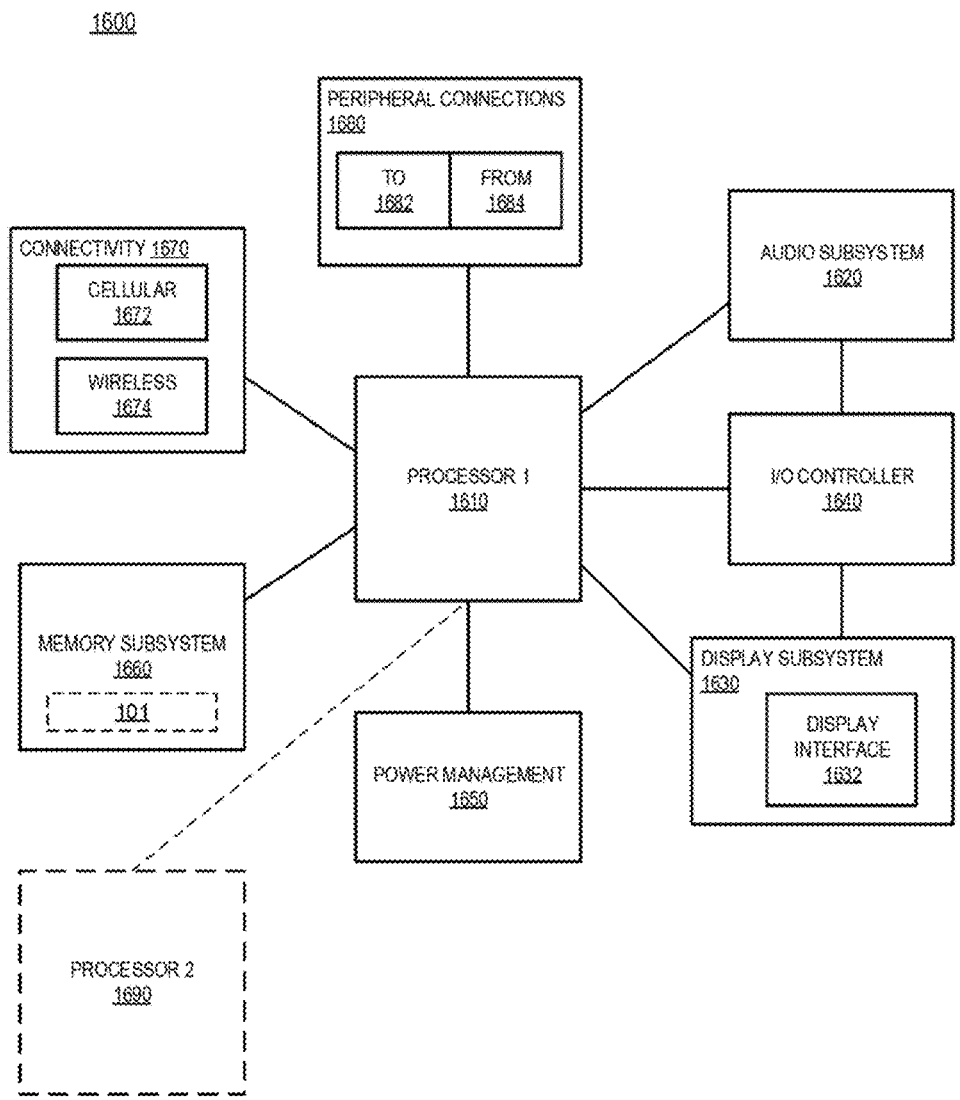
FIG. 7 illustrates a smart device or a computer system or a SoC (System-on-Chip) with apparatus to detect and mitigate defects caused by bit-line opens in a non-volatile memory, according to some embodiments.

FIG. 7 illustrates a smart device or a computer system or a SoC (System-on-Chip) with apparatus to detect and mitigate defects caused by bit-line opens in a non-volatile memory, according to some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus of memory controller 104 to detect and mitigate defects caused by bit-line opens in a non-volatile memory, according to some embodiments discussed. Other blocks of the computing device 1600 may also include apparatus of memory controller 104 to detect and mitigate defects caused by bit-line opens in a non-volatile memory, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 includes Display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 includes I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. In some embodiments, Memory subsystem 1600 includes apparatus of memory controller 104 to detect and mitigate defects caused by bit-line opens in a non-volatile memory, according to some embodiments. In some embodiments, Memory subsystem 1600 is an SSD such as SSD 101 with apparatus to detect and mitigate defects caused by bit-line opens in a non-volatile memory.

Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, PCM, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a method is provided which comprises: performing a first read from a portion of a non-volatile memory, the first read to provide a first codeword; decoding the first codeword; determining whether the decoding operation failed; performing a second read from the portion of the non-volatile memory when it is determined that the decoding operation failed, the second read to provide a second codeword; and decoding the second codeword with an errors-and-erasures decoding process. In some embodiments, the method comprises: identifying a location of an open circuit in response to performing the second read; and storing the location of the open circuit.

In some embodiments, performing the first read comprises: applying a read voltage to a selected word-line; and applying a pass voltage to all other word-lines in the portion of the non-volatile memory. In some embodiments, performing the second read comprises: applying the pass voltage to the selected word-line. In some embodiments, determining whether the decoding operation failed comprises: determining whether a number of soft errors, associated with the decoding operation, exceeds a threshold.

In some embodiments, the non-volatile memory is a NAND memory. In some embodiments, decoding the first and second codewords is performed by at least one of: a LDPC decoder; or a Reed-Solomon decoder. In some embodiments, the first and second codewords are at least one of: WPCs; or Reed-Solomon codes. In some embodiments, the errors-and-erasures decoding process comprises setting a Log Likelihood Ratio (LLR) for erasures to zero.

In another example, an apparatus is provided which comprises: read logic operable to perform a first read from a portion of a non-volatile memory, the first read to provide a first codeword; a decoder operable to decode the first codeword; and logic operable to determine whether the decoder operation failed; wherein the read logic is operable to perform a second read from the portion of the non-volatile memory when it is determined that the decoder operation failed, the second read to provide a second codeword, and wherein the decoder is operable to decode the second codeword with an errors-and-erasures decoding process.

In some embodiments, the read logic is operable to apply: a read voltage to a selected word-line to perform a first read; and a pass voltage to all other word-lines in the portion of the non-volatile memory. In some embodiments, the read logic is operable to perform the second read by applying the pass voltage to the selected word-line. In some embodiments, the decoder is at least one of: a LDPC decoder; or a Reed-Solomon decoder. In some embodiments, the non-volatile memory is a NAND memory. In some embodiments, the decoder is operable to determine whether the decoding operation failed by comparing a number of soft errors, associated with the decoding operation, against a threshold. In some embodiments, the apparatus a storage unit for storing a location of an open circuit in the non-volatile memory in response to the logic determining that the decoder operation failed.

In another example, a system is provided which comprises: a processor; a non-volatile memory; a memory controller coupled to the non-volatile memory, the memory controller including: read logic operable to perform a first read from a portion of the non-volatile memory, the first read to provide a first codeword; a decoder operable to decode the first codeword; and logic operable to determine whether the decoder operation failed; wherein the read logic is operable to perform a second read from the portion of the non-volatile memory when it is determined that the decoder operation failed, the second read to provide a second codeword, and wherein the decoder is operable to decode the second codeword with an errors-and-erasures decoding process; and a wireless interface for allowing the processor to communicate with another device.

In some embodiments, the read logic is operable to apply: a read voltage to a selected word-line to perform a first read; and a pass voltage to all other word-lines in the portion of the non-volatile memory. In some embodiments, the read logic is operable to perform the second read by applying the pass voltage to the selected word-line. In some embodiments, the non-volatile memory is a NAND memory.

In another example, a machine readable storage media is provided having machine readable instructions that, when executed, cause one or more processors to perform an operation according to the method described above.

In another example, an apparatus is provided which comprises means for performing a first read from a portion of a non-volatile memory, the first read to provide a first codeword; means for decoding the first codeword; means for determining whether the decoding operation failed; means for performing a second read from the portion of the non-volatile memory when it is determined that the decoding operation failed, the second read to provide a second codeword; and means for decoding the second codeword with an errors-and-erasures decoding process.

In some embodiments, the apparatus comprises: means for identifying a location of an open circuit in response to performing the second read; and means for storing the location of the open circuit. In some embodiments, the means for performing the first read comprises: means for applying a read voltage to a selected word-line; and means for applying a pass voltage to all other word-lines in the portion of the non-volatile memory. In some embodiments, the means for performing the second read comprises: means for applying the pass voltage to the selected word-line. In some embodiments, the means for determining whether the decoding operation failed comprises: means for determining whether a number of soft errors, associated with the decoding operation, exceeds a threshold. In some embodiments, the non-volatile memory is a NAND memory. In some embodiments, the means for decoding the first and second codewords is performed by at least one of: a LDPC decoder; or a Reed-Solomon decoder. In some embodiments, the first and second codewords are at least one of: LDPCs; or Reed-Solomon codes. In some embodiments, the errors-and-erasures decoding process comprises setting a LLR for erasures to zero.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
performing a first read from a portion of a non-volatile memory, the first read to provide a first codeword;
decoding the first codeword;
determining whether the decoding failed;
performing a second read from the portion of the non-volatile memory when it is determined that the decoding failed, the second read to provide a second codeword separate from the first codeword;
decoding the second codeword with an errors-and-erasures decoding process; and
identifying a location of an open circuit in response to performing the second read.

2. The method claim 1 comprising:
storing the location of the open circuit.

3. The method of claim 1, wherein performing the first read comprises:
applying a read voltage to a selected word-line; and
applying a pass voltage to all other word-lines in the portion of the non-volatile memory.

4. The method of claim 3, wherein performing the second read comprises:
applying the pass voltage to the selected word-line.

5. The method of claim 1, wherein determining whether the decoding failed comprises:
determining whether a number of soft errors, associated with the decoding, exceeds a threshold.

6. The method of claim 1, wherein the non-volatile memory includes a NAND memory.

7. The method of claim 1, wherein decoding the first and second codewords is performed by one of:
a Low-Density Parity-Check Code (LDPC) decoder; or
a Reed-Solomon decoder.

8. The method of claim 1, wherein the first and second codewords are one of:
Low-Density Parity-Check Codes (LDPCs); or
Reed-Solomon codes.

9. The method of claim 1, wherein the errors-and-erasures decoding process comprises setting a Log Likelihood Ratio (LLR) for erasures to zero.

10. An apparatus comprising:
read circuitry to perform a first read from a portion of a non-volatile memory, the first read to provide a first codeword;
a decoder to perform a decoder operation to decode the first codeword;
one or more circuitries to determine whether the decoder operation failed;
wherein the read circuitry is to perform a second read from the portion of the non-volatile memory when it is determined that the decoder operation failed, the second read to provide a second codeword separate from the first codeword, and wherein the decoder is to decode the second codeword with an errors-and-erasures decoding process; and
logic to identity a location of an open circuit in response to the read circuitry to perform the second read.

11. The apparatus of claim 10, wherein the read circuitry is to apply:
a read voltage to a selected word-line to perform the first read; and
a pass voltage to all other word-lines in the portion of the non-volatile memory.

12. The apparatus of claim 11, wherein the read circuitry is to perform the second read by applying the pass voltage to the selected word-line.

13. The apparatus of claim 10, wherein the decoder is one of:
a Low-Density Parity-Check Code (LDPC) decoder; or
a Reed-Solomon decoder.

14. The apparatus of claim 10, wherein the non-volatile memory includes a NAND memory.

15. The apparatus of claim 10, wherein the decoder is to determine whether the decoder operation failed by comparing a number of soft errors, associated with the decoder operation, against a threshold.

16. The apparatus of claim 10 comprises a storage unit to store the location of the open circuit in the non-volatile memory in response to the logic determining that the decoder operation failed.

17. A system comprising:
a processor;
a non-volatile memory;
a memory controller coupled to the non-volatile memory, the memory controller including:
read logic to perform a first read from a portion of the non-volatile memory, the first read to provide a first codeword;
a decoder to perform a decoder operation to decode the first codeword; and
logic to determine whether the decoder operation failed; wherein the read logic is to perform a second read from the portion of the non-volatile memory when it is determined that the decoder operation failed, the second read to provide a second codeword separate from the first codeword, and wherein the decoder is to decode the second codeword with an errors-and-erasures decoding process; and
logic to identity a location of an open circuit in response to the read circuitry to perform the second read; and
a wireless interface to allow the processor to communicate with another device.

18. The system of claim 17, wherein the read logic is to apply:
a read voltage to a selected word-line to perform the first read; and
a pass voltage to all other word-lines in the portion of the non-volatile memory.

19. The system of claim 18, wherein the read logic is to perform the second read by applying the pass voltage to the selected word-line.

20. The system of claim 17, wherein the non-volatile memory includes a NAND memory.

* * * * *

UNITED STATES PATENT AND TRADEMARK OFFICE
CERTIFICATE OF CORRECTION

PATENT NO. : 9,819,362 B2  
APPLICATION NO. : 14/671140  
DATED : November 14, 2017  
INVENTOR(S) : Ravi H. Motwani and Pranav Kalavade Page 1 of 1

It is certified that error appears in the above-identified patent and that said Letters Patent is hereby corrected as shown below:

Column 16 in Claim 17, Line 40, remove the word "circuitry" and replace with ((logic)).

Signed and Sealed this
First Day of May, 2018

Andrei Iancu
*Director of the United States Patent and Trademark Office*